US008076979B2

(12) United States Patent
Kathuria et al.

(10) Patent No.: US 8,076,979 B2
(45) Date of Patent: Dec. 13, 2011

(54) LOCK DETECTION CIRCUIT FOR PHASE LOCKED LOOP

(75) Inventors: Manan Kathuria, New Delhi (IN);
Kumar Abhishek, Ghaziabad (IN);
Suhas Chakravarty, New Delhi (IN);
Suri Roopak, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 191 days.

(21) Appl. No.: 12/416,933

(22) Filed: Apr. 2, 2009

(65) Prior Publication Data

US 2009/0251226 A1    Oct. 8, 2009

(30) Foreign Application Priority Data

Apr. 4, 2008   (IN) .............. 896/DEL/2008

(51) Int. Cl.
*H03J 7/04* (2006.01)
*H03L 7/02* (2006.01)

(52) U.S. Cl. ............. 331/1 R; 331/1 A; 331/17; 331/25; 331/27; 331/DIG. 2; 327/3; 327/7; 327/40; 327/47; 327/48; 327/156; 327/160

(58) Field of Classification Search ................. 331/1 A, 331/1 R, 17, 25, 27, DIG. 2; 327/3, 7, 40, 327/47, 48, 160, 156
See application file for complete search history.

(56) References Cited

U.S. PATENT DOCUMENTS

| 5,159,279 | A  |   | 10/1992 | Shenoi et al. |
| 5,483,558 | A  | * | 1/1996  | Leon et al. ................. 375/376 |
| 5,506,531 | A  | * | 4/1996  | Jang et al. ................. 327/156 |
| 6,177,842 | B1 | * | 1/2001  | Ahn et al. ................. 331/1 A |
| 6,229,864 | B1 | * | 5/2001  | DuFour ..................... 375/375 |
| 6,314,150 | B1 |   | 11/2001 | Vowe |
| 6,320,469 | B1 |   | 11/2001 | Friedberg et al. |
| 6,496,554 | B1 | * | 12/2002 | Ahn ......................... 375/376 |
| 6,765,444 | B2 |   | 7/2004  | Wang et al. |
| 6,794,944 | B2 | * | 9/2004  | Hirai ........................ 331/1 A |
| 6,833,763 | B2 | * | 12/2004 | Chung ....................... 331/1 A |
| 7,643,598 | B2 | * | 1/2010  | Byun et al. ................. 375/371 |
| 7,719,368 | B1 | * | 5/2010  | Smith et al. ................. 331/25 |
| 2007/0071155 | A1 | * | 3/2007 | Boerstler et al. ........... 375/376 |
| 2009/0079479 | A1 | * | 3/2009 | Chen ......................... 327/156 |

* cited by examiner

*Primary Examiner* — Arnold Kinkead
*Assistant Examiner* — Richard Tan
(74) *Attorney, Agent, or Firm* — Charles Bergere

(57) ABSTRACT

A lock detector circuit for detecting a lock condition between a reference signal and a feedback signal includes a first counter for outputting a first counter value indicative of a number of clock cycles of the reference signal, and a second counter for outputting a second counter value indicative of a number of clock cycles of the feedback signal. An asynchronous comparator receives the first and second counter values and provides an output signal having a pulse width that is proportional to the difference between the first and second counter values. A pulse width detector receives the comparator output signal and produces an output signal that is indicative of the relationship between the pulse width of the comparator output signal and a predetermined threshold value. A state machine controls the state of at least one lock indication signal according to the pulse width detector output signal.

12 Claims, 7 Drawing Sheets

LOCK DETECTION CIRCUIT FOR PHASE LOCKED LOOP

BACKGROUND OF THE INVENTION

The present invention relates to phase locked loops (PLLs) and, in particular, to lock detectors for detecting when the frequency and phase of an output clock signal generated by the PLL matches that of an input clock signal.

A Phase Locked Loop (PLL) is a control system that provides an output signal which is phase and frequency synchronized with an input signal. PLL circuits are used in numerous circuit applications, such as frequency synthesizers, clock generation, clock recovery and the like. A PLL may be implemented in either a digital or analog form. However, PLLs are often implemented as Silicon on Chip type devices (SoCs) that include on-chip clocks for generating the various signals. An integrated PLL on the chip avoids the need to provide a separate clock generator circuit and thus provides improved accuracy clocks and jitter performance.

Generally speaking, a PLL typically includes a phase detector and an oscillator. The phase detector receives the input signal (hereinafter "the reference signal") and a feedback signal provided via the oscillator, and generates an output signal proportional to the phase difference between the input and reference signals. If a phase or frequency difference exists, the oscillator is controlled to modify the frequency of its output signal, and thus the feedback signal, to correct the frequency and phase difference. Alternatively, in the event that the reference signal and the feedback signal are synchronous in frequency and phase, the oscillator maintains the phase and frequency of its output signal, and thus the feedback signal.

If the frequency and phase of the reference signal is synchronized with the feedback signal the PLL is in a "locked condition". A PLL is considered to be "locked" when the reference and feedback signals are matched within a predetermined phase and frequency limit. On the other hand, if the phase and frequency of the reference and feedback signals differ by more than the predetermined limit, the PLL is "out of lock".

Typically, a PLL includes a lock detector circuit which provides lock status signals, usually in the form of "lock" and "out-of-lock" status signals, which provide an indication of the PLL lock status. Thus, a lock detector circuit typically asserts a "lock" status signal when the difference between the reference signal and the feedback signal are within the phase and frequency limit, and de-asserts the lock status signal otherwise.

In many applications, the status signals provide a critical role in system operation and so it is desirable that a lock detector provide robust and reliable performance, which typically involves low false indications, as may be caused by signal jitter. For reliable operation, a lock detector circuit must be able to finely resolve phase differences between the reference and feedback signals.

In addition, delays in generating the status signals can affect the overall timing performance of the PLL, to the extent that a lock detector can introduce propagation delays which contribute to reduced system responsiveness. Hence, ideally a lock detector should provide robust performance and minimum propagation delay.

Some prior art lock detectors rely on mechanisms that count cycles of the feedback and reference clock cycles and then compare respective counter values using a synchronized comparator. In some lock detectors, the synchronized comparator compares the counter values on the active edge of one of the clock signals, in other words either the reference or feedback signal, and provides an output signal which is synchronized with that clock. Synchronizing the comparator with one of the clock signals may introduce undesirable phase match/mismatch information propagation since it prevents the lock detector from sensing phase differences that may arise between the active edges of the synchronizing clock signal.

It would be advantageous to have a lock detector with improved phase difference sensitivity. This may be important for devices that require accurate clocks such as devices for protocols such as for USB, PCI Express, and DDR. It also would be advantageous to have a lock detector that reduces the likelihood of false activations and deactivations of PLL lock status signals and thus provide improved robustness and reliability.

BRIEF DESCRIPTION OF THE DRAWINGS

The present invention will now be described in relation to preferred embodiments as illustrated in the accompanying drawings. However, it is to be understood that the following description is not to limit the generality of the above description.

DETAILED DESCRIPTION OF THE INVENTION

Figure 1:
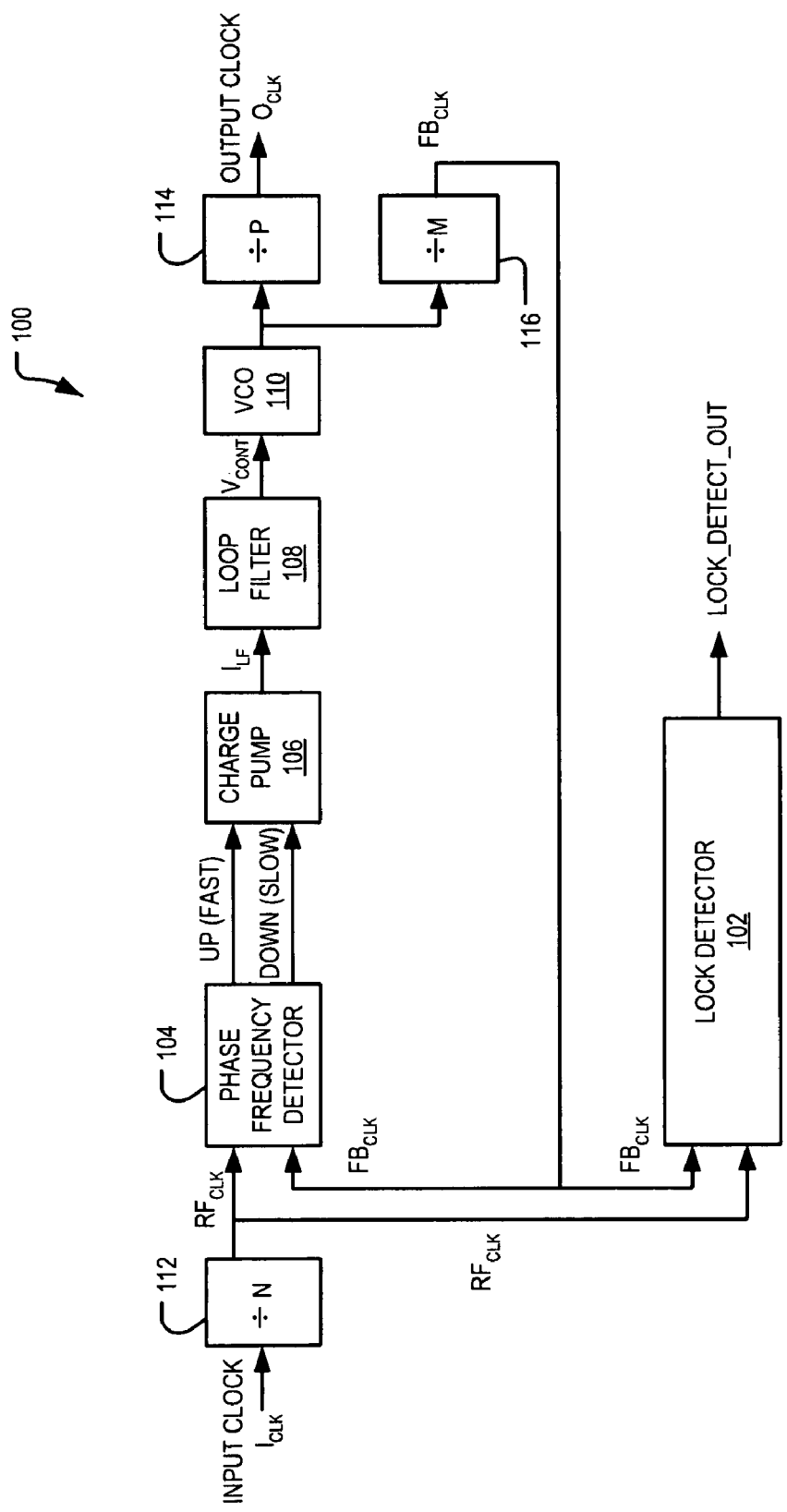
FIG. 1 is a schematic block diagram illustrating a PLL incorporating a lock detector.

The following description describes an embodiment in relation to a lock detector for incorporating in a digital phase locked loop circuit. However, it will be appreciated that other embodiments may be used for other applications that require an indication of the extent to which the phase and frequency of two signals are synchronized.

The present invention provides a lock detector circuit for detecting a lock condition between a reference signal and a feedback signal that includes a first counter outputting a first counter value indicative of a number of clock cycles of the reference signal, and a second counter outputting a second counter value indicative of a number of clock cycles of the feedback signal. An asynchronous comparator receives the first and second counter values and provides an output signal having a pulse width that is proportional to the difference between the first and second counter values. A pulse width detector receives the comparator output signal and produces an output signal that is indicative of the relationship between the pulse width of the comparator output signal and a predetermined threshold value. A state machine controls the state of at least one lock indication signal according to the pulse width detector's output signal.

The first and second counter values are continuously and asynchronously compared with one another by the asynchronous comparator. Preferably, the asynchronous comparator compares the first and second counter values at each active edge of the reference and the feedback clock. If the pulse width of the comparator's output signal is greater than the predetermined threshold value, the pulse width detector provides an output signal which activates the state machine to asynchronously control the at least one lock indication signals to indicate a "loss of lock" lock condition. Such an indication may be provided, for example, by asynchronously de-asserting an "in-lock" indication signal so as to indicate a loss of lock and/or by asserting a "loss of lock" indication signal.

On the other hand, while the difference between the first and second counter values remains below the predetermined threshold value, either a third counter or other timer is activate to conduct a count sequence which continues until a final count value or duration is reached, at which point the state machine preferably controls the at least one lock indication signal to indicate that the "loss of lock" lock condition no longer exists. The count sequence may involve, for example, counting consecutive cycles of the feedback clock signal or the reference clock signal until a predetermined number of consecutive cycles have been counted.

Preferably, control of the at least one lock indication signal to indicate that the "loss of lock" lock condition no longer exists involves synchronously controlling a lock indication signal to indicate a "in lock" lock condition.

The present invention provides a lock detector circuit that allows for substantially immediate and asynchronous transitions of a lock indication signal in response to a "loss of lock" lock condition, which advantageously reduces propagation delays that may otherwise arise. Moreover, by including a state machine which provides both asynchronous and synchronous control of the at least one lock indication signals, embodiments of the present invention may avoid, or at least substantially reduce, synchronous interactions across reference and feedback clock domains that are inherently asynchronous and that would otherwise warrant synchronizers which would likely reduce the sensitivity of the lock detector.

The first and second counters may include any suitable type of counter. In one embodiment the first and second counters are free running n-bit synchronous counters. For example, in one embodiment the first and second counters are 8-bit counters. Each counter will typically include an asynchronous reset input. The function of the reset input will be described in more detail later.

In an embodiment, the asynchronous comparator receives the first and second counter values as 'n' bit vectors and performs a combinational comparison using a suitable logic structure, such as an XOR tree. In such an embodiment, the comparator provides an output indication indicative of a difference between the respective bits of the first and second counter values. The output indication is provided in the form of a signal having a pulse width that is proportional to the difference between the first and second counter values.

As explained above, it is preferred that the comparison be conducted by the asynchronous comparator, and thus the output indication provided, on each active edge of the reference clock signal and the feedback clock signal. In this respect, the term "active edge" denotes the edge of the reference or feedback clock which is used to trigger the first and second counters respectively. As will be appreciated, a counter may be triggered by either a positive edge (that is, the rising edge) or a negative edge (that is, the falling edge) of a clock signal.

An embodiment in which the asynchronous comparator conducts the comparison on each active edge of the reference clock signal and the feedback clock signal, as opposed to the active edge of one of clock signals (in other words, the reference clock or the feedback clock) provides improved detection responsiveness since the duration between consecutive comparisons may be reduced to less than one clock cycle. Consequently, the asynchronous comparator, and thus the lock detector, is able to sense drifts in frequency and phase between the output and the feedback signals that are smaller than one clock cycle.

The pulse width detector may be configurable to allow for setting and/or adjustment of the predetermined threshold value, which value will typically be the value of the maximum acceptable phase difference between the reference and feedback signal for a lock condition. However, in one embodiment the predetermined threshold value is less than the value of the maximum acceptable phase difference and may be, for example, a value which is bounded by a predetermined maximum and minimum threshold limits values. For example, in an embodiment the maximum value limit s the maximum value of acceptable phase difference and the minimum value limit is determined as the cumulative sum of parameters which contribute to a phase difference, such as noise jitter, static deviation and the like.

The present invention provides a lock detector that supports a settable and/or adjustable threshold value, which reduces the lock detectors susceptibility to phase differences which are inherent in the circuit, jitter, noise, static deviation or the like. Accordingly, a programmable predetermined threshold will likely reduce false deactivations of the lock indication signal by ignoring phase differences that are less than the predetermined threshold value.

The predetermined threshold value is set prior to a lock detection process and is thus a "predetermined" value. In some embodiments, the predetermined threshold value may be settable and/or adjustable to provide the lock detector with improve flexibility in operation since the predetermined threshold value may be programmed for a particular application, operational conditions, PLL design and the like. In other words, a settable and/or adjustable predetermined threshold value provides the lock detector with the capability to be configured for specific applications or to compensate for inherent circuit characteristics which may otherwise reduce the reliability of the lock detector.

As explained previously, the predetermined threshold value may be set and/or adjusted so as to be less than a value of maximum acceptable value phase difference for a lock condition and may have, for example, a duration which is less than one clock cycle of the feedback or reference clocks. However, although embodiments of the lock detector may be configured to detect phase differences which are less than one clock cycle, in some embodiments the predetermined threshold value may be more than one clock cycle. For example, in some embodiments the predetermined threshold value may comprise a time period multiple (for example, a duration which is a multiple of the clock cycle period) and a remainder value. In such a case, asynchronous comparator would be configured, via the selection of a suitable counting range, to handle the time period multiple, whereas the pulse width detector would be configured to receive the asynchronous comparator output signal and provide an output signal for indicating when the pulse width of the comparator output exceeds the predetermined threshold value.

A predetermined threshold value of less than one clock cycle may improve the resolution of the lock detector in that it allows the lock detector with the capability to react to small phase differences. Thus it is envisaged that a lock detector in accordance with an embodiment will provide improved sensitivity to phase and frequency differences between the reference and feedback signals.

In one embodiment, the pulse width detector includes a programmable delay device, such as a programmable delay line, which is configurable or programmable to receive the comparator output signal and provide an output signal having a reduced pulse width compared to the comparator's output signal. In an embodiment, for example, a programmable pulse width detector is implemented using, for example, a combination of a suitable logic structure and a programmable delay device, such as a programmable delay line. For example, in one embodiment the pulse width detector includes a two input AND logic gate that accepts the comparator output signal as one of the inputs, and a time delayed version of the comparator output signal as the other input. In such an embodiment, the time delay is set or programmed to equate with the predetermined threshold value.

The pulse width detector may be configured to provide an output signal having a pulse width which is reduced relative to pulse width of the comparator output by the programmed threshold value. In this way the pulse width detector will be able to suppress phase differences less than the programmed threshold value.

In one embodiment, the state machine controls a single lock indication signal having two output states, at least one of which is indicative of a "loss of lock" lock condition. In such an embodiment, the state machine will asynchronously control state transitions to the output state which is indicative of a "loss of lock" lock condition, and synchronously control transitions from that state to the other state.

In another embodiment, the state machine controls a single lock indication signal having two states, namely, a first state which is indicative of a "loss of lock" lock condition and a second state which is indicative of an "in lock" lock condition. As will be appreciated, the first and second states will typically be logic states such as logic "high", or a logic "low" state. In such an embodiment, the state machine will asynchronously control output state transitions from the "in lock" lock condition state to the "loss of lock" lock condition state, and synchronously control output state transitions from the "loss of lock" lock condition state to the "in lock" lock condition state. Such control may be provided, for example, using a D type flip-flop type circuit which is asynchronously reset on the detection of a "loss of lock" lock condition and set on detection of a "lock" lock condition. Suitable asynchronous and synchronous schemes will be described in more detail later.

In yet another embodiment, the state machine controls two lock indications signals. For example, the state machine may control a first output signal for indicating that the reference and feedback signal are in lock, and a second output signal for indicating a loss of lock. In an embodiment, the state machine synchronously controls the first output signal (that is, a lock signal) and asynchronously controls the second output signal (that is, a loss of lock signal).

In addition to controlling at least one lock indication signal, in one embodiment the state machine is configured to asynchronously reset the first and second counters in response to the pulse width detector output indicating that the pulse width of the comparator output exceeds the predetermined threshold value and thus reset the respective counter values. Thus, in one embodiment, on detecting a "loss of lock" lock condition the state machine substantially simultaneously and asynchronously resets the first and second counters and activates the loss of lock signal.

Alternatively, and when the pulse width detector output indicates that the pulse width of the comparator output does not exceed the predetermined threshold value, the first and second counters continue to increment, and in response to detecting a predetermined number of consecutive cycles of the first and second counter, the state machine synchronously controls the lock indication signal to indicate an "in lock" condition.

The present invention also provides a method of detecting a lock condition between a reference signal and a feedback signal that includes the steps of providing a first counter that outputs a first counter value indicative of a number of clock cycles of the reference signal, and a second counter that outputs a second counter value indicative of a number of clock cycles of the feedback signal;

comparing the a first counter value and a second counter value and producing a first signal having a pulse width which is proportional to the difference between the first and second counter values;

detecting the pulse width of the first signal and producing a second signal which is indicative of the relationship between the pulse width of the first output signal and a predetermined threshold value; and controlling the state of at least one lock indication signal according to the second signal.

Providing a lock detector that includes a state machine which provides asynchronous control of the lock indication signal for indicating a "loss of lock" condition permits the lock detector to provide a lock indication signal that exhibits improved responsiveness to a change in the lock condition from lock to unlock. In particular, the use of a state machine which is configured to provide asynchronous control of the lock indication signal in response to a loss of lock condition permits the lock detector to indicate a loss of lock condition on either active edge of the reference or feedback clock signals.

Referring initially to FIG. 1 there is shown a block diagram for a phase locked loop 100 including a lock detector 102 in accordance with an embodiment of the invention. The PLL 100 includes a phase frequency detector 104, a charge pump 106, a loop filter 108, a voltage controller oscillator (VCO) 110, and frequency dividers 112, 114, 116.

While the operation of the PLL 100 would be well understood by a skilled person, it is nevertheless helpful, for the purposes of this description, to briefly explain the function and role of the PLL components.

The phase frequency detector 104 receives and compares the phase of a reference signal ($RF_{CLK}$) with a feedback signal ($FB_{CLK}$) that is produced by dividing the output signal of the voltage controlled oscillator 110 by M using the divider 116 so that $RF_{CLK}$ has 1/M the frequency of the VCO 110 output signal. In the present case, $RF_{CLK}$ is produced by dividing input signal $I_{CLK}$ by N using the divider 112 so that $RF_{CLK}$ has 1/N the frequency of $I_{CLK}$. The typical characteristics (such as frequency and amplitude) of the input signal $I_{CLK}$, the reference signal $RF_{CLK}$ and the feedback signal $FB_{CLK}$ will vary according to the application, as would be understood by a skilled reader.

The phase frequency detector 104 supplies a charge to the charge pump 106 in proportion to the phase error between $RF_{CLK}$ and $FB_{CLK}$. In the present example, the charge is provided by control pulses UP (FAST) and DOWN (SLOW).

The UP (FAST) and DOWN (SLOW) control pulses provide equal-charge positive and negative current pulses respectively when there is no phase error between $RF_{CLK}$ and $FB_{CLK}$. However, if $RF_{CLK}$ and $FB_{CLK}$ are mismatched, either the UP (FAST) or DOWN (SLOW) control pulse will contain slightly more charge, depending on the mismatch relationship between $RF_{CLK}$ and $FB_{CLK}$, thus causing the charge pump 106 to produce an output signal $I_{LF}$ which is input to the loop filter 108 to produce, for input to the VCO 110, output signal $V_{CONT}$. $V_{CONT}$ controls the voltage controlled oscillator 110 to modify the feedback signal $FB_{CLK}$ to closer synchronize with the phase and frequency of $RF_{CLK}$ and thus reduce the mismatch.

During the control process, the loop filter 108 attenuates unwanted frequency components from the UP (FAST) or DOWN (SLOW) control pulses to ensure that the output signal $V_{CONT}$ is within the voltage controlled oscillator's 110 control range.

The control process continues until the phase and frequency of $FB_{CLK}$ and $RF_{CLK}$ are matched within a predetermined limit. When $FB_{CLK}$ and $RF_{CLK}$ are matched within the predetermined limit, the lock detector 102 provides an indication signal LOCK_DET_OUT having a state which is indicative of a "lock condition". Otherwise, LOCK_DET_OUT indicates an "out of lock" condition.

Figure 2:
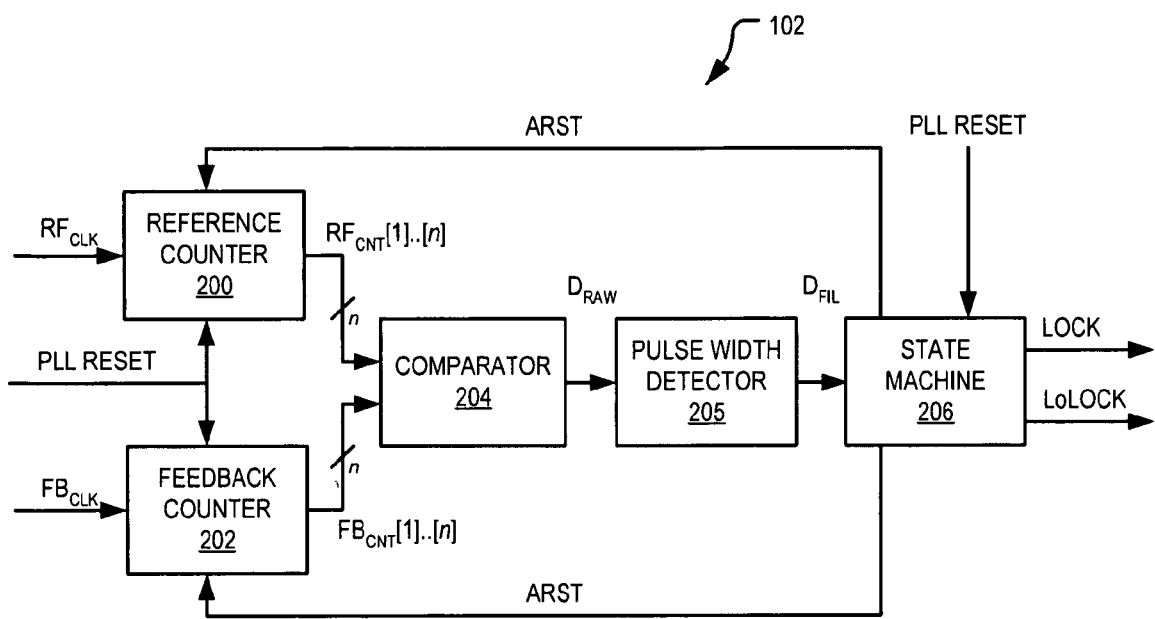
FIG. 2 is a schematic block diagram for a lock detector in accordance with an embodiment of the present invention.

Referring now to FIG. 2 there is shown a block diagram illustrating a lock detector 102 according to an embodiment of the invention. The lock detector 102 includes a first counter 200 (shown as a reference counter), a second counter 202 (shown as a feedback counter), a comparator 204, a pulse width detector 205, and a state machine 206.

The first or reference counter 200 receives $RF_{CLK}$ and outputs a first counter value indicative of a number of clock cycles of the reference signal $RF_{CLK}$. The second or feedback counter 202 receives $FB_{CLK}$ and outputs a second counter value indicative of a number of clock cycles of the feedback signal $FB_{CLK}$. Each counter 200, 202 provides an n-bit output. Indeed, in the present example each counter 200, 202 is an 8-bit counter, with an asynchronous reset input, capable of counting a maximum of 256 cycles of $RF_{CLK}$ or $FB_{CLK}$ respectively.

It will of course be appreciated that other than 8-bit counters may be used to provide, for example, an increased or reduced number of count cycles. However, the number of bits of each counter will be selected to provide a maximum count which is at least equal to, and typically greater than, the minimum duration for which $FB_{CLK}$ and $RF_{CLK}$ must match in phase and frequency, within a predetermined limit, in order for those signals to be considered "locked" and thus the PLL in a "locked condition". In other words, the width of each counter 200, 202 will typically be selected according to the number of consecutive clock cycles of the $FB_{CLK}$ or $RF_{CLK}$ respectively that must be detected before assertion of the lock indication signal. As will be explained in more detail later, for the counters 200, 202 to increment, the phase error must be less than the predetermined threshold value. In the present example, the $RF_{CLK}$ and $FB_{CLK}$ are 48 MHz, and the predetermined threshold value is 2 nS.

The comparator 204 receives the first and second counter values as $RF_{CNT}[1]\ldots[n]$ and $FB_{CNT}[1]\ldots[n]$ and provides an output signal $D_{RAW}$ having a pulse width which is proportional to the difference between the first counter 200 and second counter 202 counter values. In the present example, each counter 200, 202 includes an asynchronous reset input (ARST) which is controlled by the state machine 206 and asserted to reset each counter 200, 202, and thus each counter value, when required. In the present example, the state machine 206 will activate ARST to asynchronously reset each counter 200, 202 and substantially simultaneously control the LoLOCK signal to indicate a "loss of lock" lock condition whenever $D_{RAW}$ is indicative of a phase difference which exceeds the predetermined threshold value. As will be appreciated, activating ARST will substantially immediately reset the counting cycle of each counter 200, 202.

Advantageously, the ARST and LoLOCK signals may be activated on the active edges of $FB_{CLK}$ and $RF_{CLK}$. The role of the reset function will be described in more detail later.

A PLL RESET signal is also provided. As will be explained in more detail later, the PLL RESET may be activated to asynchronously reset the counters 200, 202 and synchronously reset the state machine 206.

Figure 3:
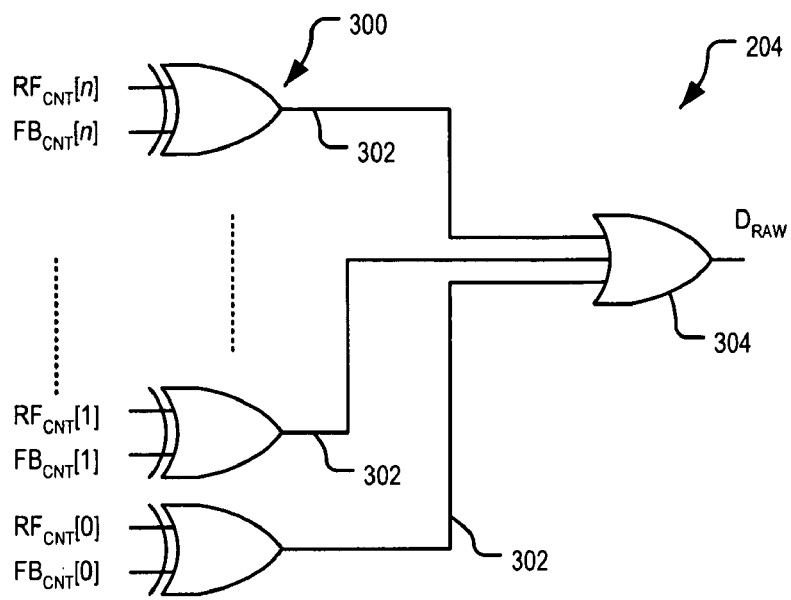
FIG. 3 is a schematic diagram of an asynchronous comparator suitable for incorporating in the lock detector of FIG. 2.

FIG. 3 illustrates a schematic diagram for one embodiment of a comparator 204 suitable for incorporating in an embodiment of the lock detector 102 depicted in FIG. 2. In the illustrated embodiment, the comparator 204 is implemented as an XOR tree 300 having plural outputs 302 which are provided as inputs to a multi-input OR gate 304, though it will be appreciated that other logic structures may also be suitable.

Figure 4:
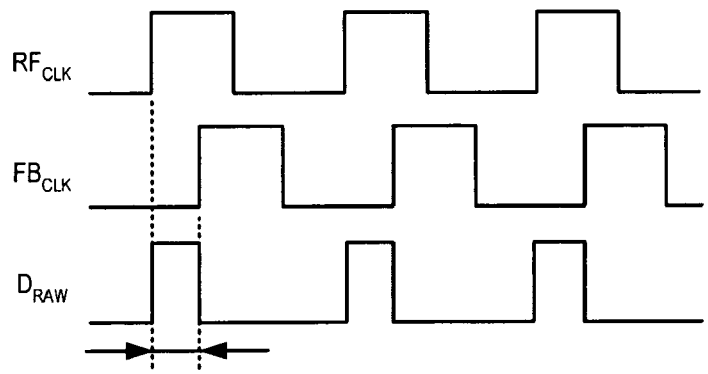
FIG. 4 is a signal timing diagram showing relationships between input and output signals of the comparator of FIG. 3.
Figure 5:
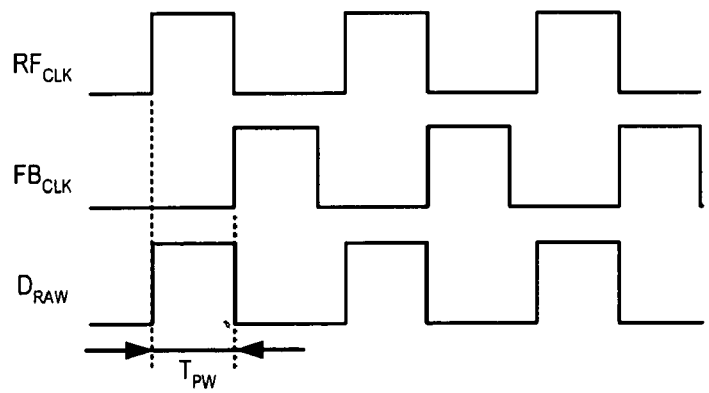
FIG. 5 is another timing diagram showing relationships between input and output signals of the comparator of FIG. 3.

The output $D_{RAW}$ of the comparator 204 is a status signal which indicates the comparison result. In the present example, $D_{RAW}$ is asynchronously asserted whenever, and for as long as, there is a difference between the count values $FB_{CNT}$ and $RF_{CNT}$ of counters 200, 202 (ref. FIG. 2). In the illustrated configuration, the comparator 204 compares corresponding bits of the first count value $FB_{CNT}$ and the second count value $RF_{CNT}$. In other words, the comparator performs a bit-wise XOR on the two n-bit vectors $FB_{CNT}$ and $RF_{CNT}$. If the two vectors are unequal, $D_{RAW}$ will be held high, signaling that the comparison result is unequal. Otherwise, if the two vectors are equal, $D_{RAW}$ will be held low, signaling that the two vectors are equal. In the illustrated embodiment, and as is depicted in FIG. 4 and FIG. 5, $D_{RAW}$ has a pulse width $T_{PW}$ which is proportional to the difference between the first counter 200 and second counter 202 values. Advantageously, the pulse width $T_{PW}$ of $D_{RAW}$ is independent of the lead or lag relationship between $FB_{CNT}$ and $RF_{CNT}$ and is capable of being produced when the phase difference is less than one-clock cycle, as depicted in FIG. 4.

Returning to FIG. 2, the pulse width detector 205 provides an output signal $D_{FIL}$ which is indicative of the relationship between the pulse width of the output signal $D_{RAW}$ of the comparator 204 (ref. FIG. 2) and a predetermined threshold value $D_{ALLOW}$. In the embodiment illustrated in FIG. 2, the pulse width detector 205 provides an output signal $D_{FIL}$ signal which is indicative of the pulse width of the comparator's 204 output signal $D_{RAW}$ exceeding the predetermined threshold value $D_{ALLOW}$.

Figure 6:
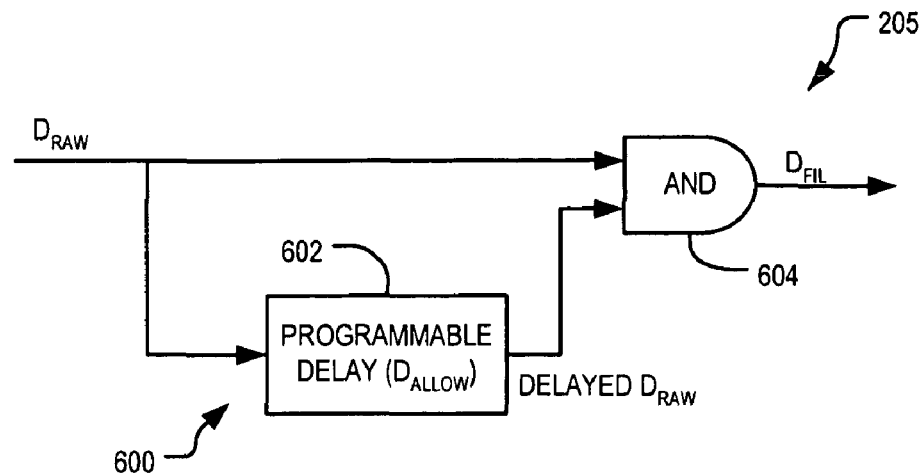
FIG. 6 is a schematic diagram of an embodiment of a pulse width detector suitable for incorporating in the lock detector of FIG. 2.

FIG. 6 shows a schematic diagram for an example pulse width detector 205. In the illustrated example, the pulse width detector comprises a delay element 600, in the form of a programmable delay device 602, and an AND gate 604. In the present example, the programmable delay device 602 is settable and/or adjustable to provide a delay which corresponds with the predetermined threshold value $D_{ALLOW}$. It is not essential that the pulse width detector 205 include a programmable delay device 602 (such as a programmable delay line), since a fixed delay device may be selected that provides the predetermined threshold value $D_{ALLOW}$. However, a programmable delay device 602 may allow the pulse width detector 205, and thus the lock detector 102 (ref. FIG. 2), to be configurable to suit system or circuit characteristics, such as inherent characteristics, which may contribute to phase differences or errors which are less than the difference or error required for the PLL to be considered as being in an "out of lock" condition.

Figure 7:
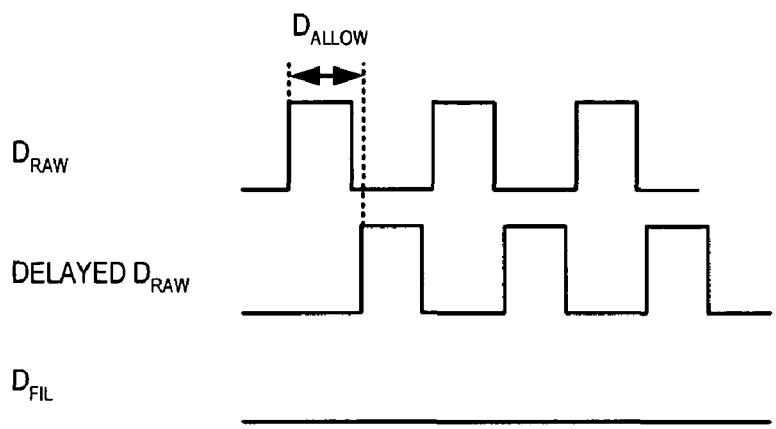
FIG. 7 is a signal timing diagram showing relationships between input and output signals of the pulse width detector of FIG. 6.
Figure 8:
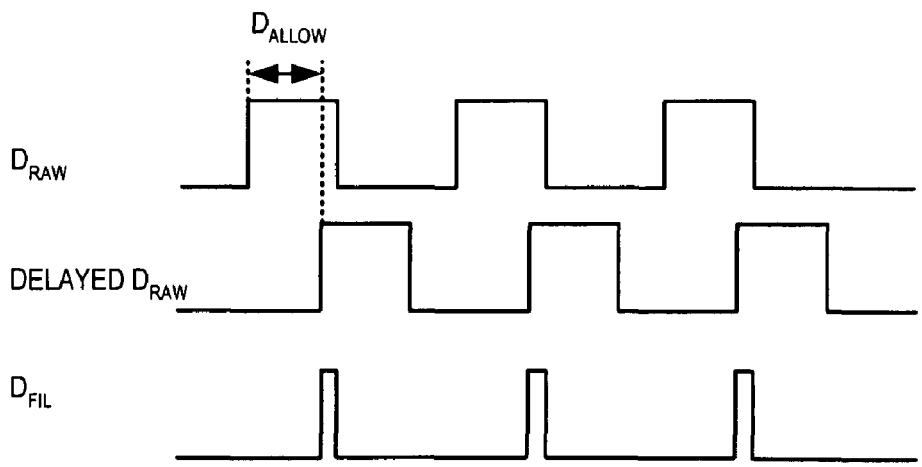
FIG. 8 is another timing diagram showing relationships between input and output signals of the pulse width detector of FIG. 3.

As shown in FIGS. 7 and 8, the pulse width detector illustrated in FIG. 6 provides an output signal $D_{FIL}$ which is indicative of the pulse width of the comparator's output signal $D_{RAW}$ exceeding the predetermined threshold value $D_{ALLOW}$.

Figure 9:
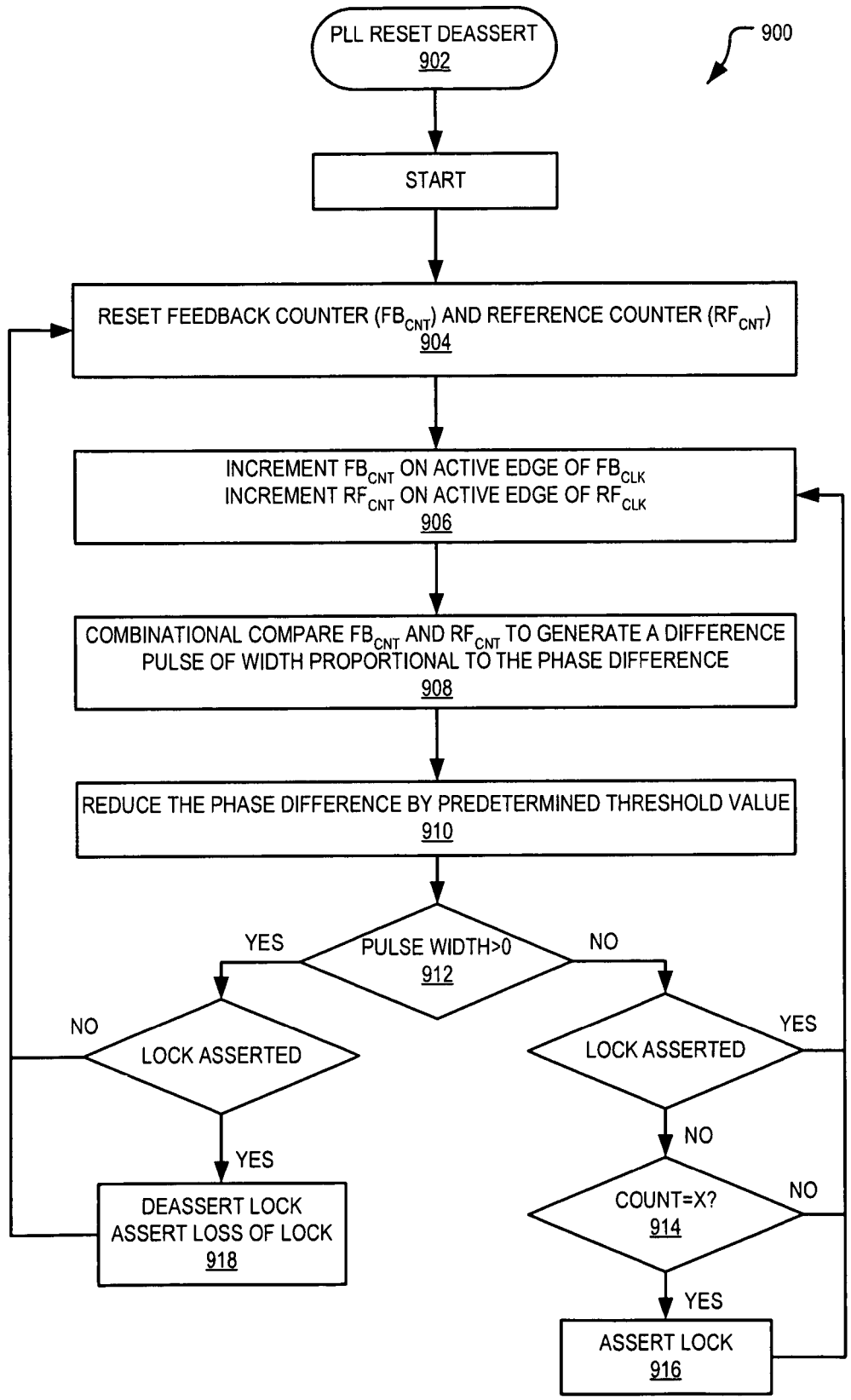
FIG. 9 is a flow diagram for a lock detector in accordance with an embodiment.

Returning to FIG. 2, the state machine 206 controls the state of lock indication signals LOCK and LoLOCK according to the pulse width detector's 205 output signal $D_{RAW}$, or a signal derived from $D_{RAW}$. The operation of the state machine 206, and thus the lock detector 102, is best described with reference to FIG. 9, which illustrates a flow diagram of a suitable lock detector process 700, and FIG. 10 which illustrates a state diagram 1000 for the state machine 206.

Figure 10:
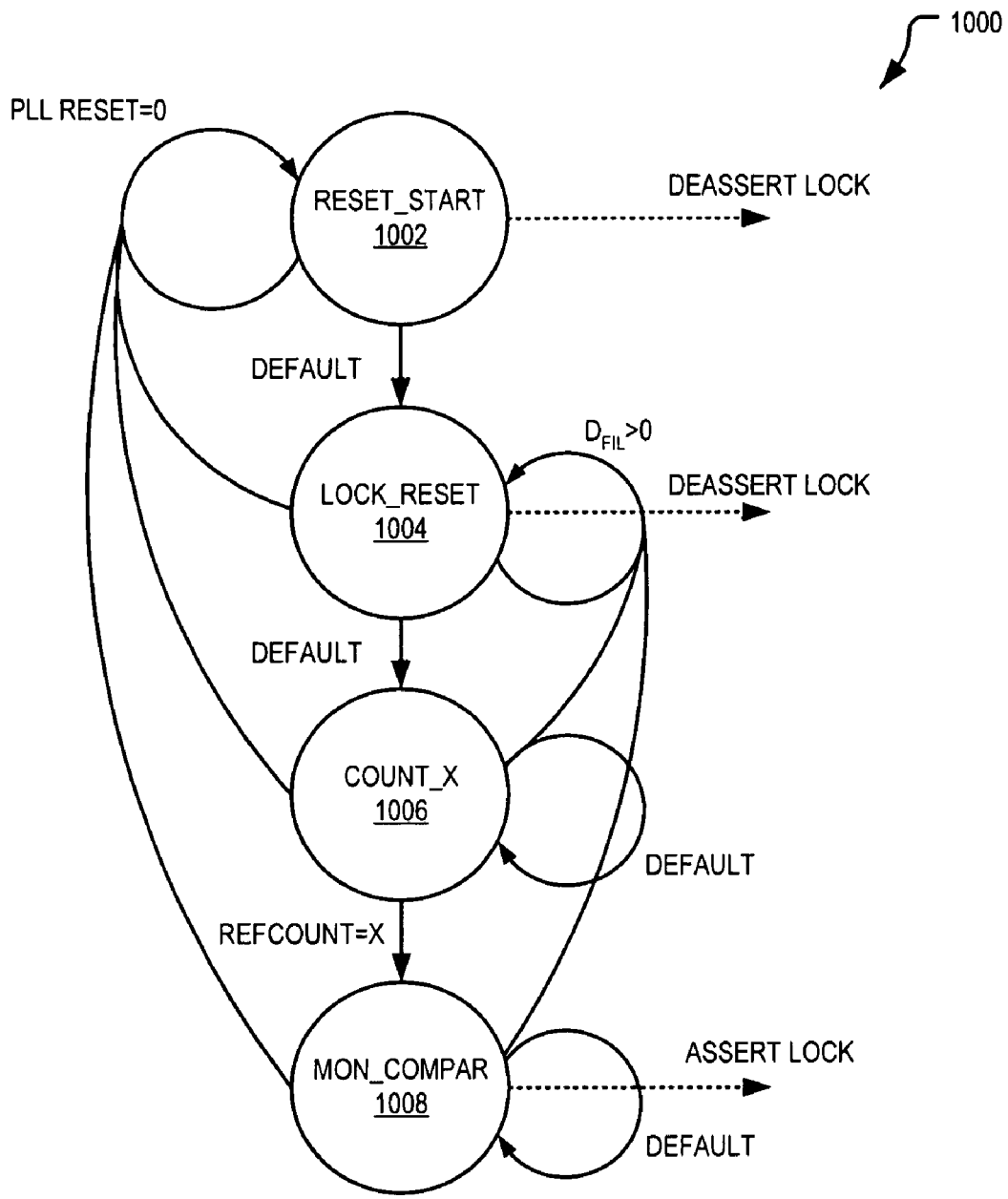
FIG. 10 is a state diagram for a state machine suitable for incorporating in the lock detector of FIG. 2.

As is shown, the lock detection process 900 commences, at step 902, with de-assertion of PLL reset. On de-assertion of the PLL reset, the state machine 206 (ref. FIG. 2) synchronously transitions from a RESET_START state 1002 to a LOCK_RESET state 1004 (ref. FIG. 10) in which the ARST signal (ref. FIG. 2) is asserted and thus the counters 200, 202 (ref. FIG. 2) reset at step 904.

At step 906, and after the counters 200, 202 have been reset, the ARST signal is de-asserted, in which state the counters 200, 202, and thus the respective counter values $FB_{CNT}$ and $RF_{CNT}$ increment on the active edges of the $FB_{CLK}$ or $RF_{CLK}$ respectively. In addition, the state machine 206 transitions to a state COUNT_X 1006 (ref. FIG. 10) in which it counts the number of consecutive cycles of $FB_{CLK}$ and $RF_{CLK}$.

At step 908, the comparator 204 (ref. FIG. 2) compares $FB_{CNT}$ and $RF_{CNT}$ and generates an output signal $D_{RAW}$ having a pulse width that is proportional to the phase difference between $FB_{CLK}$ and $RF_{CLK}$. In this respect, since the counter values $FB_{CNT}$ and $RF_{CNT}$ increment on the active edges of the $FB_{CLK}$ or $RF_{CLK}$, and are thus incremented independently of each other, any phase difference between $FB_{CLK}$ and $RF_{CLK}$ at either active edge will result in a difference in the counter values $FB_{CNT}$ and $RF_{CNT}$. The duration of the difference determines the pulse width of $D_{RAW}$.

At step 910, $D_{RAW}$ is input into the pulse width detector 205 (ref. FIG. 2) which provides an output signal $D_{FIL}$ for indicating when the pulse width of the comparator 204 (ref. FIG. 2) output exceeds a predetermined threshold value.

In the present case, the pulse width detector 205 effectively reduces the pulse width by a predetermined threshold value using a suitable circuit, such as the delay line and logic AND gate combination depicted in FIG. 8. Thus, in the present example, the pulse width detector 205 (ref. FIG. 2) suppresses any phase difference or error less than the predetermined threshold value $D_{ALLOW}$.

At step 912, $D_{FIL}$ is received by the state machine 206 (ref. FIG. 2). In the event that $D_{FIL}$ is indicative of no phase difference or phase error the state machine 206 permits the counters 200, 202 to continue to increment on the respective active edges of $FB_{CLK}$ or $RF_{CLK}$. In this condition, the state machine 206 continuously monitors, using a third counter, the current count COUNTX of the consecutive cycles of $FB_{CLK}$ or $RF_{CLK}$. At step 914, if a preset count is achieved the state machine 206 synchronously transitions to a MON_COMPAR 1008 (ref. FIG. 10) state in which it asserts, at step 916, the lock indication signal LOCK. In the present example, the counters 200, 202 continue to increment. The state machine 206 will remain in the MON_COMPAR state 1008 until it is forced into another state as a result of a phase difference or error being detected which exceeds the predetermined threshold value.

On the other hand, in the event that $D_{FIL}$ is indicative of a phase difference which exceeds the predetermined threshold value, the state machine 206 asynchronously transitions to a LOCKRESET state (ref. FIG. 10) in which it de-asserts, at step 918, the lock indication signal LOCK and resets the counters 200, 202. In the event that the previous state was the MON_COMPAR state 1008 (ref. FIG. 10), the state machine 206 also asserts the LoLOCK signal indicating a loss of lock.

Figure 11:
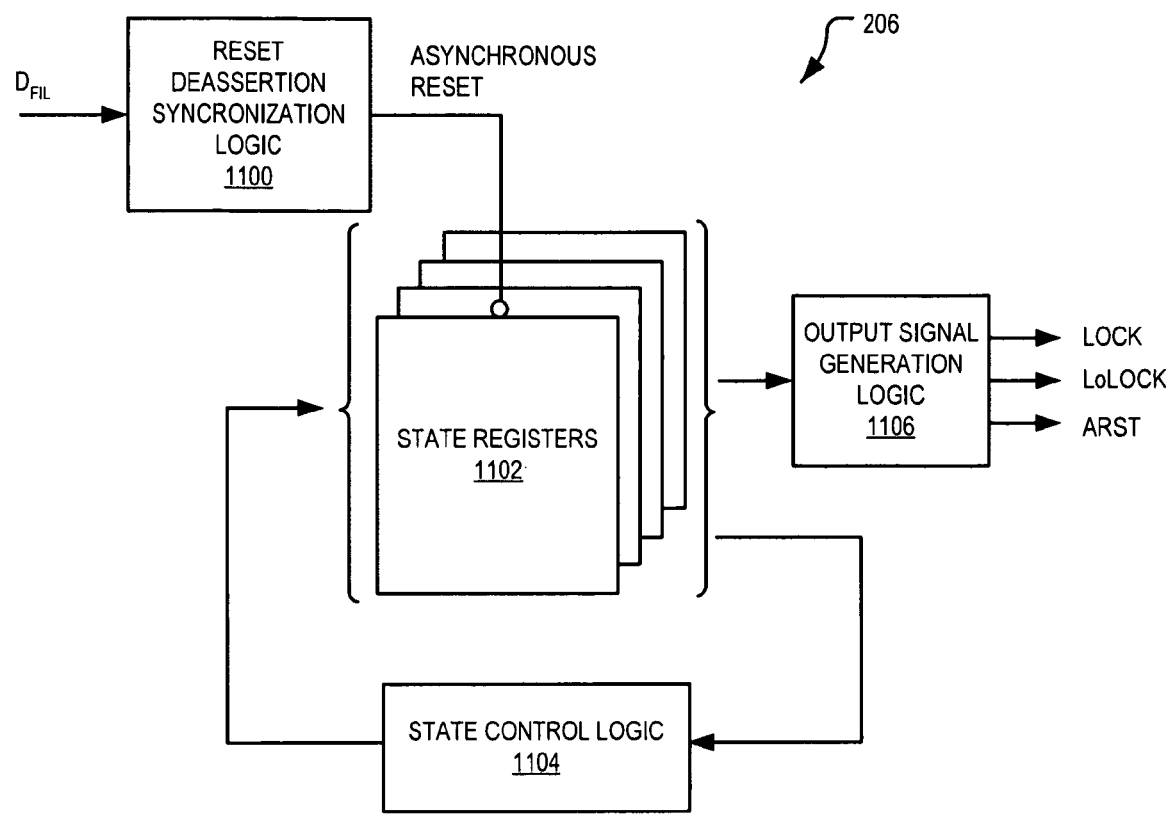
FIG. 11 is block diagram of a state machine suitable for incorporating into the lock detector of FIG. 2.

Referring now to FIG. 11 there is shown a block diagram for an example state machine 206 suitable for use with an embodiment of the lock detector 102. In the illustrated example the state machine 206 includes reset de-assertion synchronization logic 1100, state registers 1102, state control logic 1104, and output signal generation logic 1106. The reset de-assertion synchronization logic 1100 receives the DFIL signal as an input and synchronizes its de-assertion before sending it to the state registers 1102. The operation of the state registers 1102, state control logic 1104, and output signal generation logic 1106 would be understood by a skilled reader.

Although in the above described embodiments the invention is implemented primarily as a SoC, in other embodiments the invention may be implemented primarily in hardware or software using, for example, hardware components such as an application specific integrated circuit (ASICs). Implementation of a hardware state machine so as to perform the functions described herein will be apparent to persons skilled in the relevant art. In other embodiments, the invention may be implemented using a combination of both hardware and software.

Finally, it is to be understood that various alterations, modifications and/or additions may be introduced into the constructions and arrangements of parts previously described without departing from the spirit or ambit of the invention.

The invention claimed is:

1. A lock detector circuit for detecting a lock condition between a reference signal and a feedback signal, comprising:
    a first counter that outputs a first counter value indicative of a number of clock cycles of the reference signal;
    a second counter that outputs a second counter value indicative of a number of clock cycles of the feedback signal;
    an asynchronous comparator connected to the first and second counters and receives the first and second counter values and generates a comparator output signal having a pulse width that is proportional to the difference between the first and second counter values;
    a pulse width detector, connected to the comparator, that receives the comparator output signal and generates an output signal that is indicative of the relationship between the pulse width of the comparator output signal and a predetermined threshold value; and
    a state machine, connected to the pulse width detector, for controlling the state of at least one lock indication signal according to the pulse width detector output signal,
    wherein when the pulse width detector output signal indicates that the pulse width of the comparator output signal exceeds the predetermined threshold value, the state machine asynchronously resets the first and second counters, and wherein the first and second counters continue to increment otherwise.

2. The lock detector circuit of claim 1, wherein the pulse width detector output signal is indicative of the pulse width of the comparators output signal exceeding the predetermined threshold value.

3. The lock detector circuit of claim 2, wherein the predetermined threshold value is settable and/or adjustable.

4. The lock detector circuit of claim 2, further comprising:
a third counter for conducting a count sequence while the pulse width detector output signal is indicative of the comparator output signal not exceeding the predetermined threshold value, and wherein when the third counter count sequence value equals or exceeds a predetermined count value, the state machine controls the lock indication signal to indicate a lock condition.

5. The lock detector circuit of claim 1, wherein when the pulse width detector output signal indicates that the pulse width of the comparator output signal exceeds the predetermined threshold value, the state machine asynchronously controls the lock indication signal to indicate an out of lock condition.

6. The lock detector circuit of claim 1, wherein the comparator compares the first and second counter values at each active edge of the reference clock signal and the feedback clock signal.

7. A lock detector circuit for detecting a lock condition between a reference signal and a feedback signal, comprising:
a first counter outputting a first counter value indicative of a number of clock cycles of the reference signal;
a second counter outputting a second counter value indicative of a number of clock cycles of the feedback signal;
an asynchronous comparator that receives the first and second counter values and generates a comparator output signal having a pulse width that is proportional to the difference between the first and second counter values;
a pulse width detector that receives the comparator output signal and produces an output signal that is indicative of the relationship between the pulse width of the comparator output signal and a predetermined threshold value; and
a state machine that receives the pulse width detector output signal and:
when the pulse width detector output signal is indicative of the comparator output signal exceeding the predetermined threshold value, asynchronously resetting the first and second counters and providing a lock indication signal indicative of an out of lock condition, and
when the pulse width detector output signal is indicative of the comparator output signal not exceeding the predetermined threshold value, and after detecting a predetermined number of consecutive increments of the first and second counters, providing a lock indication signal indicative of a lock condition.

8. The lock detector circuit of claim 7, wherein the predetermined threshold value is settable and/or adjustable.

9. The lock detector circuit of claim 8, wherein the comparator compares the first and second counter values at each active edge of the reference clock signal and the feedback signal.

10. A method of detecting a lock condition between a reference signal and a feedback signal, comprising:
providing a first counter that outputs a first counter value indicative of a number of clock cycles of the reference signal;
providing a second counter that outputs a second counter value indicative of a number of clock cycles of the feedback signal;
comparing the first counter value and the second counter value and producing a first signal having a pulse width that is proportional to the difference between the first and second counter values;
detecting the pulse width of the first signal and producing a second signal that is indicative of the relationship between the pulse width of the first signal and a predetermined threshold value;
controlling the state of at least one lock indication signal according to the second signal;
when the second signal is indicative of the first signal exceeding the predetermined threshold value, asynchronously resetting the first and second counters and providing a lock indication signal indicative of an out of lock condition; and
when the second signal is indicative of the first signal not exceeding the predetermined threshold value, and after detecting a predetermined number of consecutive increments of the first and second counters, providing a lock indication signal indicative of a lock condition.

11. The method of detecting a lock condition of claim 10, wherein the predetermined threshold value is settable and/or adjustable.

12. The method of detecting a lock condition of claim 10, wherein the comparison is conducted at each active edge of the reference clock signal and the feedback clock signal.

* * * * *